United States Patent
Morita et al.

(10) Patent No.: US 10,879,067 B2
(45) Date of Patent: Dec. 29, 2020

(54) PATTERN FORMING METHOD AND METHOD OF MANUFACTURING SEMICONDUCTOR DEVICE

(71) Applicant: TOSHIBA MEMORY CORPORATION, Tokyo (JP)

(72) Inventors: Seiji Morita, Tokyo (JP); Takashi Sato, Kanagawa (JP); Ryosuke Yamamoto, Aichi (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/281,221

(22) Filed: Feb. 21, 2019

(65) Prior Publication Data

US 2020/0090926 A1    Mar. 19, 2020

(30) Foreign Application Priority Data

Sep. 18, 2018  (JP) .................................. 2018-173537

(51) Int. Cl.
| | |
|---|---|
| *H01L 21/027* | (2006.01) |
| *H01L 21/3115* | (2006.01) |
| *H01L 21/3105* | (2006.01) |
| *G03F 7/38* | (2006.01) |
| *H01L 21/311* | (2006.01) |

(52) U.S. Cl.
CPC ............ *H01L 21/0273* (2013.01); *G03F 7/38* (2013.01); *H01L 21/3115* (2013.01); *H01L 21/31058* (2013.01); *H01L 21/31144* (2013.01)

(58) Field of Classification Search
None
See application file for complete search history.

(56) References Cited

U.S. PATENT DOCUMENTS

| | | |
|---|---|---|
| 6,709,806 B2 | 3/2004 | Hotta et al. |
| 9,411,237 B2 | 8/2016 | Xie et al. |
| 9,690,185 B2 | 6/2017 | Yaegashi |

(Continued)

FOREIGN PATENT DOCUMENTS

| | | |
|---|---|---|
| JP | H7-5695 A | 1/1995 |
| JP | 2001-345537 A | 12/2001 |

(Continued)

OTHER PUBLICATIONS

M. Madou, Fundamentals of Microfabrication, CRC Press, Boca Raton, p. 6. (Year: 1997).*

(Continued)

*Primary Examiner* — Jiong-Ping Lu
(74) *Attorney, Agent, or Firm* — Finnegan, Henderson, Farabow, Garrett & Dunner, L.L.P.

(57) ABSTRACT

In one embodiment, a pattern forming method includes forming a first film on a substrate. The method further includes supplying energy to the first film to form a first region to which the energy have been supplied, and a second region including at least a region to which the energy has not been supplied. The method further includes impregnating at least the first region out of the first and second region with metal atoms. The method further includes developing the first film after impregnating the first region with the metal atoms to remove the second region while leaving the first region.

17 Claims, 9 Drawing Sheets

(56) References Cited

U.S. PATENT DOCUMENTS

2014/0255852 A1\* 9/2014 Iwao .................... G03F 7/38
430/325
2015/0241787 A1\* 8/2015 Yaegashi ................ G03D 13/00
430/296

FOREIGN PATENT DOCUMENTS

JP           3761040 B2    3/2006
JP        2015-162477 A    9/2015

OTHER PUBLICATIONS

Asano, "Sub-100 nm Lithography with KrF Exposure Using Multiple Development Method," Jpn. J. Appl. Phys., 38:6999-7003 (1999).
Teh et al., "Fabrication of quasi-three-dimensional micro/nanomechanical components using electron beam cross-linked poly (methyl methacrylate) resist," J. Vac. Sci. Technol., 21:3007-11 (2003).
Gu et al., "Photobase Generator Enabled Pitch Division: A Progress Report," Advances in Resist Materials and Processing Technology, 7972:79720F-1 to 79720F-13 (2011).

\* cited by examiner

PATTERN FORMING METHOD AND METHOD OF MANUFACTURING SEMICONDUCTOR DEVICE

CROSS REFERENCE TO RELATED APPLICATION

This application is based upon and claims the benefit of priority from the prior Japanese Patent Application No. 2018-173537, filed on Sep. 18, 2018, the entire contents of which are incorporated herein by reference.

FIELD

Embodiments described herein relate to a pattern forming method and a method of manufacturing a semiconductor device.

BACKGROUND

It is considered to enhance etching resistance of an etching mask formed of an organic film or the like by impregnating the etching mask with metal atoms. The problem in such a case is how to impregnate a film such as the etching mask with metal atoms.

DETAILED DESCRIPTION

In one embodiment, a pattern forming method includes forming a first film on a substrate. The method further includes supplying energy to the first film to form a first region to which the energy have been supplied, and a second region including at least a region to which the energy has not been supplied. The method further includes impregnating at least the first region out of the first and second region with metal atoms. The method further includes developing the first film after impregnating the first region with the metal atoms to remove the second region while leaving the first region.

Embodiments will now be explained with reference to the accompanying drawings. In FIGS. 1A to 14, the same or similar configurations are given the same signs, and their duplicate description is omitted.

First Embodiment

Figure 1A:
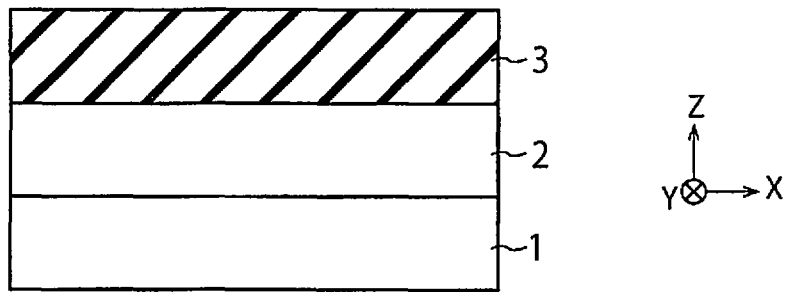
FIGS. 1A to 1C are cross-sectional views showing a method of manufacturing a semiconductor device of a first embodiment.
Figure 1B:
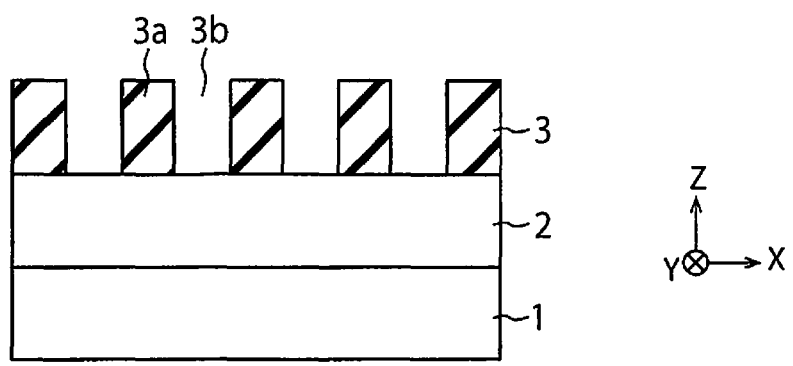
Figure 1C:
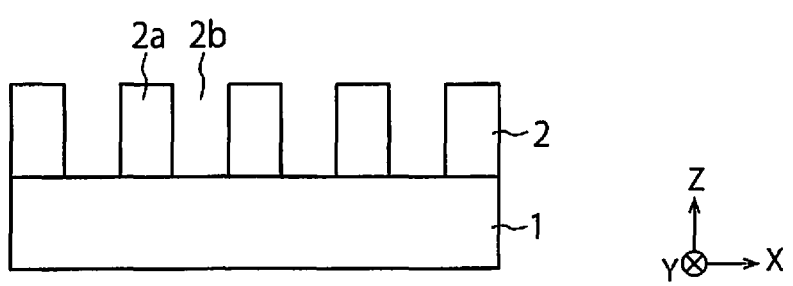

FIGS. 1A to 1C are cross-sectional views showing a method of manufacturing a semiconductor device of a first embodiment.

First, on a substrate 1, a process target film 2 is formed (FIG. 1A). Next, on the process target film 2, a mask layer 3 is formed (FIG. 1A).

The substrate 1 is, for example, a semiconductor substrate such as a silicon substrate. FIGS. 1A to 1C show an X-direction and a Y-direction which are parallel to the surface of the substrate 1 and perpendicular to each other, and a Z-direction perpendicular to the surface of the substrate 1. In the specification, the +Z-direction is regarded as the upward direction and the −Z-direction is regarded as the downward direction. The −Z-direction may coincide with the direction of gravity, or may be not to coincide with the direction of gravity.

The process target film 2 is, for example, an insulating layer, a semiconductor layer or a conductor layer. The process target film 2 may be a stacked film including a plurality of layers.

The mask layer 3 is, for example, an organic film such as a resin layer. Examples of the material composing the resin layer include hemicellulose methacrylate and hemicellulose acrylate. Details of the material composing the resin layer are mentioned later. The mask layer 3 of the present embodiment is used as an etching mask for processing the process target film 2. The mask layer 3 is exemplarily a first film. The process target film 2 is exemplarily a second film.

Next, the mask layer 3 is processed into a desired pattern (FIG. 1B). FIG. 1B shows a plurality of line patterns 3a formed from the mask layer 3, and a plurality of space patterns 3b which are gaps between the line patterns 3a. The line patterns 3a and the space patterns 3b, of the present embodiment each has a shape extending in the Y-direction. Details of the step of FIG. 1B are mentioned later.

Next, the process target film 2 is processed by etching using the mask layer 3 (FIG. 1C). FIG. 1C shows a plurality of line patterns 2a formed from the process target film 2, and a plurality of space patterns 2b which are gaps between the line patterns 2a. The line patterns 2a and the space patterns 2b of the present embodiment each has a shape extending in the Y-direction.

After that, the mask layer 3 on the process target film 2 is removed. Furthermore, various inter layer dielectrics, line layers, plug layers and the like are formed on the substrate 1. As above, the semiconductor device of the present embodiment is manufactured.

FIGS. 2A to 2E are structural formulae for explaining molecular structures in the mask layer 3 of the first embodiment.

Figure 2A:
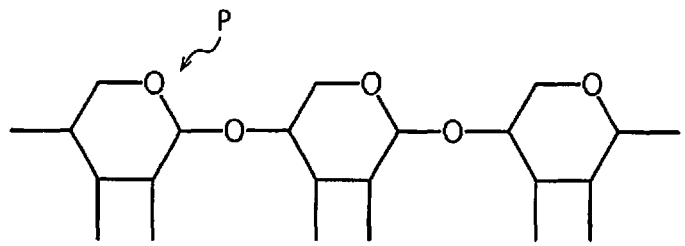
FIGS. 2A to 2E are structural formulae for explaining molecular structures in a mask layer of the first embodiment.

FIG. 2A shows a polymer molecule composing the mask layer 3 in FIG. 1A. This polymer molecule has a plurality of unit portions P, and the unit portions P are bonded to one another with oxygen atoms (0). Each unit portion P has a cyclic structure formed by one oxygen atom and five carbon atoms bonding together. FIG. 2A further shows two carbon chains bonding to two of those carbon atoms. The polymer molecule further contains hydrogen atoms bonding to the carbon atoms. The polymer molecule is exemplarily a first molecule. The unit portion P is exemplarily a first portion.

The number of the oxygen atoms composing the cyclic structure may be other than one. Moreover, the number of the carbon atoms composing the cyclic structure may be other than five. Moreover, the number of the unit portions P composing each polymer molecule may be any number.

Figure 2B:
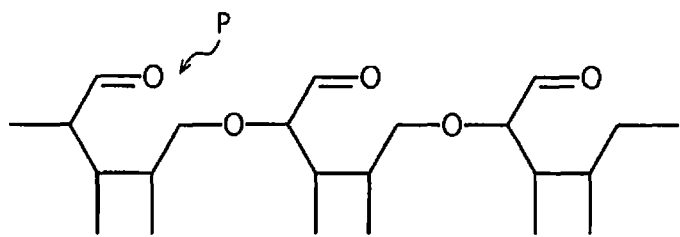

When some sort of energy is supplied to the mask layer 3 by irradiating the mask layer 3 with radiation or by heating the mask layer 3, the structure of the polymer molecule changes from the structure in FIG. 2A to a structure in FIG. 2B. Examples of the radiation include electromagnetic waves such as visible light and EUV (Extreme Ultraviolet) light, and a particle beam such as an electron beam.

Specifically, the structure of the unit portion P is to change from the cyclic structure as shown in FIG. 2A to an acyclic structure as shown in FIG. 2B. The acyclic structure is a structure in which a bond between one of the carbon atoms and one of the oxygen atoms in the cyclic structure is cleaved. As a result, that oxygen atom is to bond to its neighboring carbon atom with a double bond.

The polymer molecule in which the unit portions P have the acyclic structures can bond to metal atoms. Specifically, the metal atoms can be caused to coordinate to the unit portions P. In this case, the mask layer 3 that contains these polymer molecules can be impregnated with metal atoms.

Meanwhile, the polymer molecule in which the unit portions P have the cyclic structures cannot bond to the metal atom. Specifically, the metal atom cannot be caused to coordinate to the unit portions P. In this case, the mask layer 3 that contains these polymer molecules cannot be impregnated with metal atoms.

Examples of types of the metal atoms include aluminum (Al), titanium (Ti), hafnium (Hf), tungsten (W), tantalum (Ta), ruthenium (Ru) and zirconium (Zr). Etching resistance of the mask layer 3 can be enhanced by impregnating the mask layer 3 with such metal atoms. In the present embodiment, the metal atoms can be caused to coordinate to the unit portions P, for example, by impregnating the mask layer 3 with gas containing the metal atoms. Examples of such gas include TMA (Trimethylaluminum) gas.

Figure 2C:
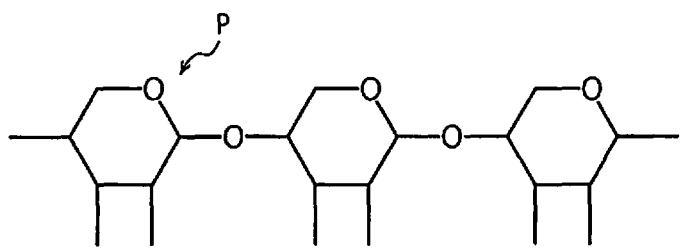
Figure 2D:
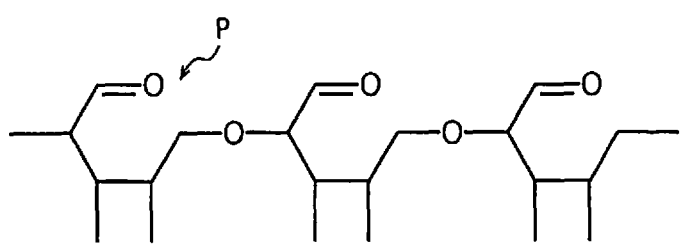

In the case of irradiating the mask layer 3 with electromagnetic waves, when the intensity of the electromagnetic waves with which the mask layer 3 is irradiated at a certain place is increased, the structure of the polymer molecule at the place changes from the structure in FIG. 2A to the structure in FIG. 2B by irradiation with the electromagnetic waves, and further changes from the structure in FIG. 2B to a structure in FIG. 2C. When the intensity of the electromagnetic waves is further increased, the structure of the polymer molecule changes from the structure in FIG. 2C to a structure in FIG. 2D, and further changes from the structure in FIG. 2D to a structure in FIG. 2E.

The unit portion P shown in FIG. 2C has a cyclic structure as in FIG. 2A. The unit portion P shown in FIG. 2D has an acyclic structure as in FIG. 2B. As above, as the intensity of the electromagnetic waves with which the mask layer 3 is irradiated at a certain place is increasing, the structure of the unit portion P at the place repeatedly changes from one of the cyclic structure and the acyclic structure to the other. The same also applies to the case where the dosage of a particle beam with which the mask layer 3 is irradiated is increasing, and the case where the temperature of the mask layer 3 is rising due to heating of the mask layer 3.

Figure 2E:
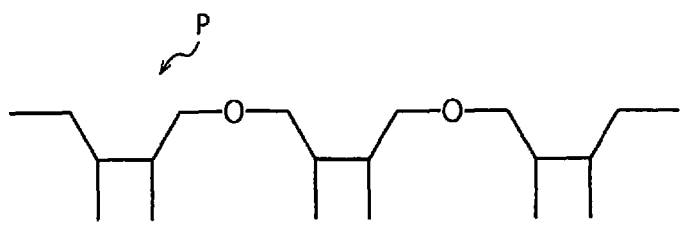

The structure of the unit portion P of the present embodiment changes from one of the cyclic structure and the acyclic structure to the other three times (FIGS. 2A to 2D), and after that, changes to the structure as shown in FIG. 2E. While the unit portion P in FIG. 2E has an acyclic structure, one carbon atom and one oxygen atom are eliminated from the unit portion P. Therefore, even when the intensity of the electromagnetic waves is further increased, the structure of the unit portion P does not change to another structure. While in the present embodiment, three times of change from one of the cyclic structure and the acyclic structure to the other arise until the structure in FIG. 2E appears, the number of times of such change arising may be other than three.

The structures and the natures of the molecules composing the mask layer 3 have been described as above. The mask layer 3 may be composed of molecules having other structures and natures. For example, change from FIG. 2A to FIG. 2E may arise as an accumulated irradiation amount of the electromagnetic waves with which a certain place is irradiated is increasing, not with the increase in intensity of the electromagnetic waves with which the place is irradiated. Otherwise, such change may arise with an increase in accumulated irradiation amount of a particle beam with which the place is irradiated, or with an increase in accumulated thermal energy supplied to the place.

In the present embodiment, inside the mask layer 3, a region that contains many polymer molecules the unit portions P of which have the acyclic structures, and a region that contains many polymer molecules the unit portions P of which have the cyclic structures are formed. The former region is exemplarily a first region. The latter region is exemplarily a second region. After that, after the mask layer 3 is impregnated with the metal atoms, the mask layer 3 is developed. As a result, the mask layer 3 that is in the first region remains to be the line pattern 3a, and the mask layer 3 that is in the second region is removed to be the space pattern 3b (FIG. 1B). Details of such processing are mentioned later.

FIGS. 3A to 3D are cross-sectional views showing a first example of the method of manufacturing a semiconductor device of the first embodiment.

Figure 3A:
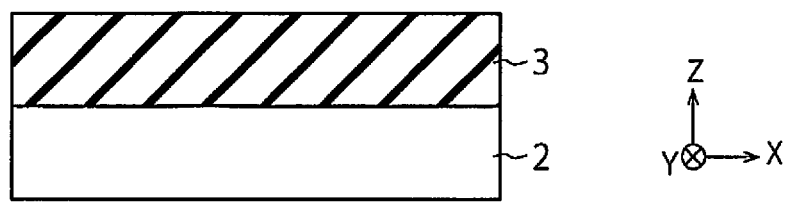
FIGS. 3A to 3D are cross-sectional views showing a first example of the method of manufacturing a semiconductor device of the first embodiment.

First, the mask layer 3 is formed on the process target film 2 by the step of FIG. 1A (FIG. 3A). Illustration of the substrate 1 is properly omitted in the figures in and after FIG. 3A. Next, the mask layer 3 is irradiated with the electromagnetic waves (FIG. 3B).

Figure 3B:
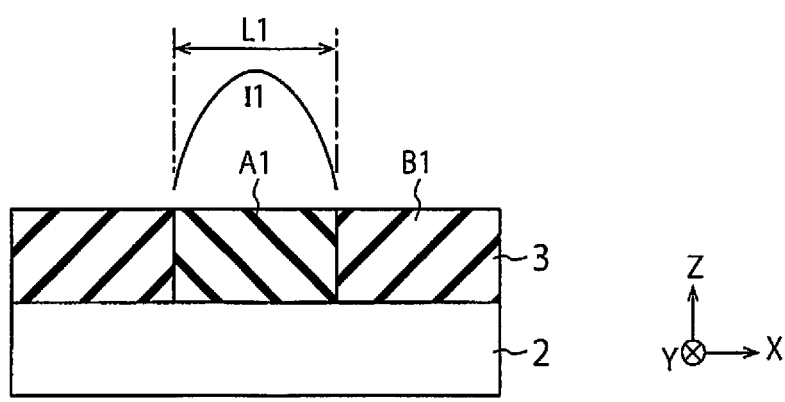

Sign "I1" shown in FIG. 3B schematically denotes an intensity distribution of the electromagnetic waves with which the mask layer 3 is irradiated. Heights of a parabola indicated by sign "I1" indicate intensities of the electromagnetic waves with which places in the mask layer 3 are irradiated. In other words, the parabola indicated by sign "I1" indicates an intensity distribution in an in-plane direction of the substrate 1. Sign "L1" denotes the width of an irradiation range with the electromagnetic waves in the X-direction.

By irradiating the mask layer 3 with such electromagnetic waves, regions A1 and B1 extending in the Y-direction are formed in the mask layer 3. Since the region A1 has been irradiated with the electromagnetic waves, the unit portions P of the polymer molecule in the region A1 change to the acyclic structures in FIG. 2B. Therefore, since the unit portions P in the region A1 can coordinate to the metal atoms, the region A1 is impregnatable with the metal atoms. Meanwhile, since the region B1 has not been irradiated with the electromagnetic waves, the unit portions P of the polymer molecule in the region B1 are maintained to have the cyclic structures in FIG. 2A. Therefore, since the unit portions P in the region B1 cannot coordinate to the metal atom, the region B1 is incapable of undergoing impregnation with the metal atom. The region A1 is exemplarily the first region. The region B1 is exemplarily the second region. Herein, the region A1 is a region to which energy from the electromagnetic waves has been supplied, and the region B1 is a region to which energy from the electromagnetic waves has not been supplied.

In the step of FIG. 3B, in place of irradiating the mask layer 3 with the electromagnetic waves, the mask layer 3 may be irradiated with the particle beam, or the mask layer 3 may be heated. In this case, the intensity of the electromagnetic waves in the aforementioned description is replaced by the dosage of the particle beam or the temperature of the mask layer 3.

Figure 3C:
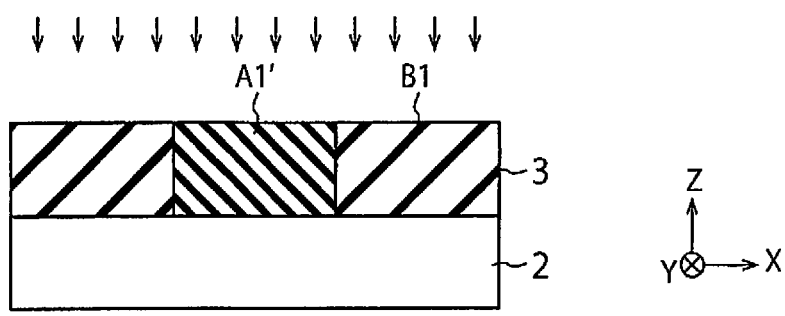

Next, the mask layer 3 is impregnated with the metal atoms (FIG. 3C). In this stage, for the aforementioned reason, only the region A1 out of the regions A1 and B1 is impregnated with the metal atoms. As a result, the region A1 changes to a region A1' metallized with the metal atoms.

Figure 3D:
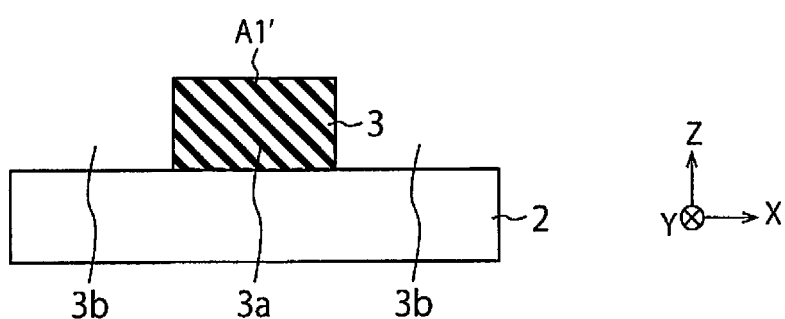

Next, the mask layer 3 is developed (FIG. 3D). The region A1' of the present embodiment is enhanced in terms of etching resistance by the metallization. Therefore, the region B1 can be removed while leaving the region A1' in place. As a result, the mask layer 3 that is in the region A1' remains to be the line pattern 3a, and the mask layer 3 that is in the region B1 is removed to the space patterns 3b. The development of the present embodiment is performed, for example, by RIE (Reactive Ion Etching).

Not only the region A1 contains only the polymer molecules the unit portions P of which have the acyclic structures, but also it may contain the polymer molecules the unit portions P of which have the acyclic structures in a high concentration. Moreover, not only the region B1 contains only the polymer molecules the unit portions P of which have the cyclic structures, but also it may contain the polymer molecules the unit portions P of which have the cyclic structures in a high concentration. For example, a ratio of the concentration of the polymer molecules the unit portions P of which have the acyclic structures relative to the concentration of the polymer molecules the unit portions P of which have the cyclic structures may be 7:3 in the region A1 and 3:7 in the region B1. In this case, the region A1' is to contain the metal atom in a higher concentration, and the region B1 is to contain the metal atom in a lower concentration. As a result, etching resistance of the region A1' can be made higher than etching resistance of the region B1, and the region B1 can be removed while leaving the region A1' in place. The same also applies to the first and second regions in FIGS. 4A to 4D and FIGS. 5A to 5D mentioned later.

In the step of FIG. 3B, other places of the mask layer 3 may also be simultaneously or sequentially irradiated with the electromagnetic waves having the intensity distribution indicated by sign "I1". Thereby, more line patterns 3a and space patterns 3b can be formed. Shapes of these patterns 3a and 3b may be shapes other than the straight lines extending in the Y-direction.

FIGS. 4A to 4D are cross-sectional views showing a second example of the method of manufacturing a semiconductor device of the first embodiment.

The steps in FIGS. 4A to 4D correspond to the steps in FIGS. 3A to 3D, respectively. The intensity distribution and the width of the electromagnetic waves are herein replaced to "I2" and "L2" from "I1" and "L1", respectively. It is supposed that the peak value of the intensity distribution "I2" is higher than the peak value of the intensity distribution "I1".

Figure 4A:
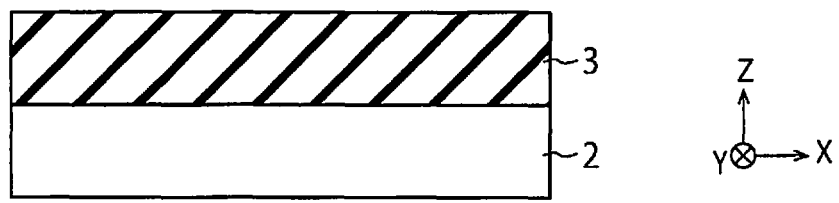
FIGS. 4A to 4D are cross-sectional views showing a second example of the method of manufacturing a semiconductor device of the first embodiment.
Figure 4B:
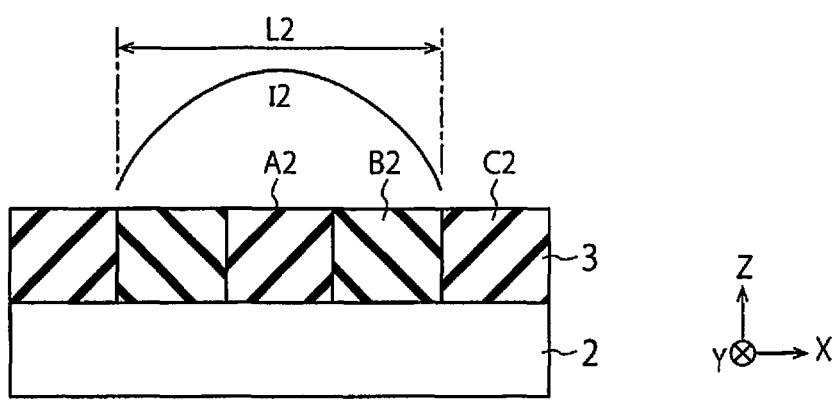

By irradiating the mask layer 3 with such electromagnetic waves, regions A2, B2 and C2 extending in the Y-direction are formed in the mask layer 3. Since the region A2 is irradiated with intense electromagnetic waves, the unit portions P of the polymer molecule in the region A2 change to the cyclic structures in FIG. 2C. Since the region B2 is irradiated with weak electromagnetic waves, the unit portions P of the polymer molecule in the region B2 change to the acyclic structures in FIG. 2B. Since the region C2 is not irradiated with the electromagnetic waves, the unit portions P of the polymer molecule in the region C2 are maintained to have the cyclic structures in FIG. 2A. Therefore, since only the unit portions P in the region B2 can coordinate to the metal atoms, only the region B2 is impregnatable with the metal atoms. The region B2 is exemplarily the first region. Each of the regions A2 and C2 is exemplarily the second region. In FIG. 4B, a plurality of first regions and a plurality of second regions can be alternately formed in the mask layer 3. Herein, the regions A2 and B2 are regions to which energy from the electromagnetic waves has been supplied, and the region C2 is a region to which energy from the electromagnetic waves has not been supplied.

Figure 4C:
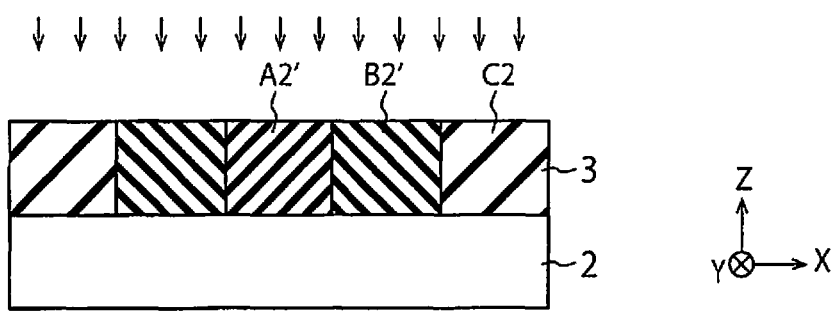
Figure 4D:
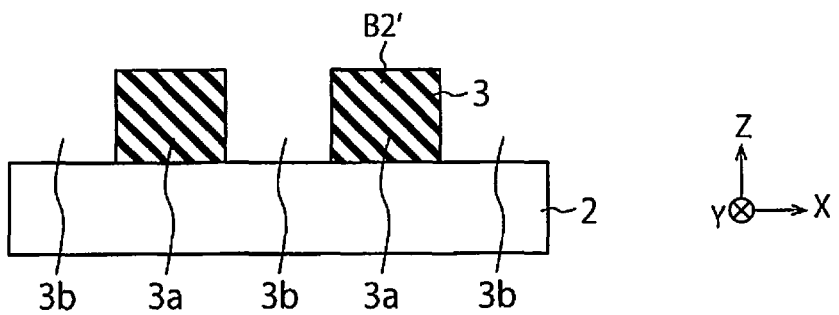

In FIG. 4C, only the region B2 out of the regions A2, B2 and C2 is impregnated with the metal atoms. As a result, the region B2 changes to a region B2' metallized with the metal atoms. Therefore, in FIG. 4D, the regions A2 and C2 can be removed while leaving the region B2' in place. As a result, the mask layer 3 that is in the region B2' remains to be the line patterns 3a, and the mask layer 3 that is in the regions A2 and C2 is removed to be the space patterns 3b.

FIGS. 5A to 5D are cross-sectional views showing a third example of the method of manufacturing a semiconductor device of the first embodiment.

The steps in FIGS. 5A to 5D correspond to the steps in FIGS. 4A to 4D, respectively. The intensity distribution and the width of the electromagnetic waves are herein replaced to "I3" and "L3" from "I2" and "L2", respectively. It is supposed that the peak value of the intensity distribution "I3" is higher than the peak value of the intensity distribution "I2".

Figure 5A:
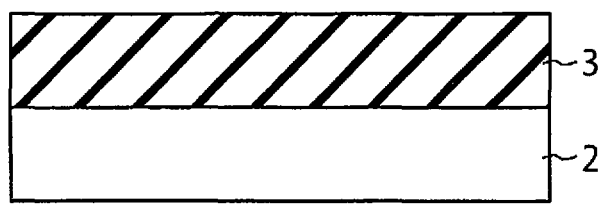
FIGS. 5A to 5D are cross-sectional views showing a third example of the method of manufacturing a semiconductor device of the first embodiment.
Figure 5A:
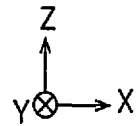
Figure 5B:
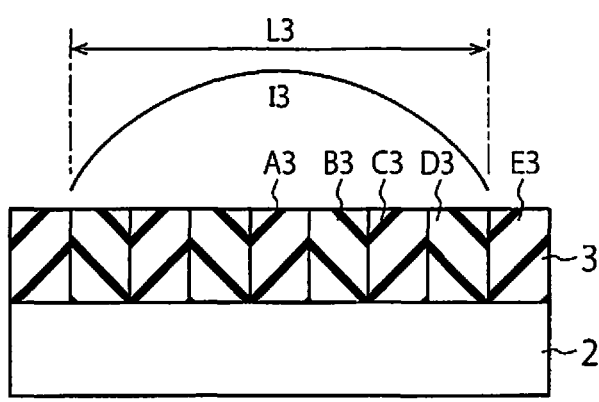
Figure 5B:
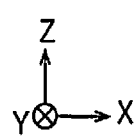

By irradiating the mask layer 3 with such electromagnetic waves, regions A3, B3, C3, D3 and E3 extending in the Y-direction are formed in the mask layer 3. Since the region A3 is irradiated with intense electromagnetic waves, the unit portions P of the polymer molecule in the region A3 change to cyclic structures next to FIG. 2D (it is herein supposed to change to the cyclic structures next to FIG. 2D, not to the acyclic structures in FIG. 2E). Since the region B3 is irradiated with moderately intense electromagnetic waves, the unit portions P of the polymer molecule in the region B3 change to the acyclic structures in FIG. 2D. Since the region C3 is irradiated with relatively weak electromagnetic waves, the unit portions P of the polymer molecule in the region C3 change to the cyclic structures in FIG. 2C. Since the region D3 is irradiated with weak electromagnetic waves, the unit portions P of the polymer molecule in the region D3 change to the acyclic structures in FIG. 2B. Since the region E3 is not irradiated with the electromagnetic waves, the unit portions P of the polymer molecule in the region E3 are maintained to have the cyclic structures in FIG. 2A. Therefore, since only the unit portions P in the regions B3 and D3 can coordinate to the metal atoms, only the regions B3 and D3 are impregnatable with the metal atoms. Each of the regions B3 and D3 is exemplarily the first region. Each of the regions A3, C3 and E3 is exemplarily the second region. In FIG. 5B, a plurality of first regions and a plurality of second regions can be alternately formed in the mask layer 3. Herein, the regions A3, B3, C3 and D3 are regions to which energy from the electromagnetic waves has been supplied, and the region E3 is a region to which energy from the electromagnetic waves has not been supplied.

Figure 5C:
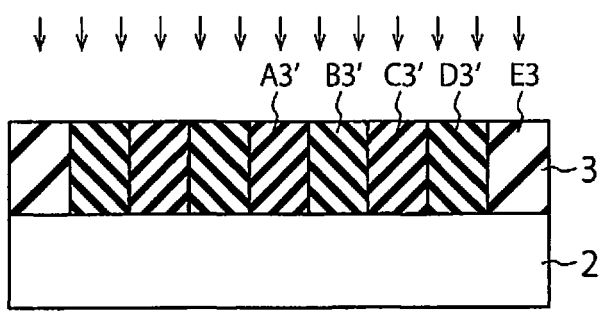
Figure 5C:
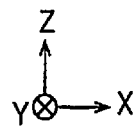
Figure 5D:
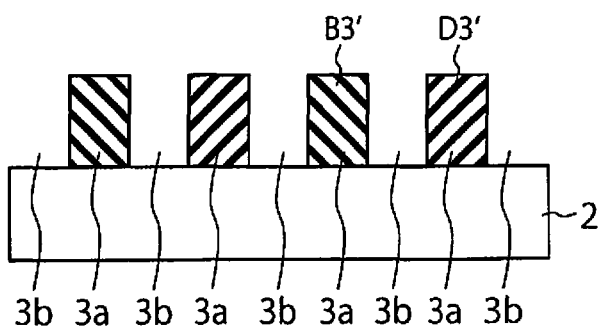
Figure 5D:
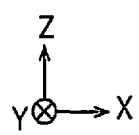

In FIG. 5C, only the regions B3 and D3 out of the regions A3, B3, C3, D3 and E3 are impregnated with the metal atoms. As a result, the regions B3 and D3 change to regions B3 and D3' metallized with the metal atoms. Therefore, in FIG. 5D, the regions A3, C3 and E3 can be removed while leaving the regions B3 and D3' in place. As a result, the mask layer 3 that is in the regions B3 and D3' remain to be the line patterns 3a, and the mask layer 3 that is in the regions A3, C3 and E3 is removed to be the space patterns 3b.

In the mask layer 3 of FIG. 3B, the structure of the unit portion P is caused to change from one of the cyclic structure and the acyclic structure to the other at most once. As a result, one first region (A1) is formed in the mask layer 3. In the mask layer 3 of FIG. 4B, the structure of the unit portion P is caused to change from one of the cyclic structure and the acyclic structure to the other at most twice. As a result, two first regions (B2) are formed in the mask layer 3. In the mask layer 3 of FIG. 5B, the structure of the unit portion P is caused to change from one of the cyclic structure and the acyclic structure to the other at most four times. As a result, four first regions (B3 and D3) are formed in the mask layer 3.

As above, in the present embodiment, by causing the structure of the unit portion P to change from one of the cyclic structure and the acyclic structure to the other at most N times (N is an integer of one or more) in the mask layer 3, N first regions can be formed in the mask layer 3.

Figure 6:
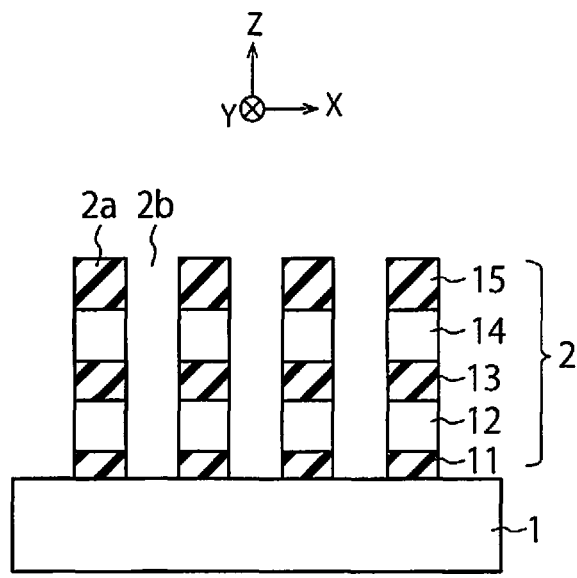
FIG. 6 is a cross-sectional view exemplarily showing a structure of the semiconductor device of the first embodiment.

FIG. 6 is a cross-sectional view exemplarily showing a structure of the semiconductor device of the first embodiment.

FIG. 6 exemplarily shows the semiconductor device manufactured by the steps in FIGS. 1A to 1D. The process target film 2 shown in FIG. 6 includes a tunnel insulator 11, a charge storage capacitor 12, a block insulator 13, a control electrode layer 14 and a cap insulator 15, these sequentially formed on the substrate 1. Each line pattern 2a shown in FIG. 6 configures a memory cell of a flash memory. As above, according to the method of the present embodiment, memory cells of a flash memory can be produced, for example.

While in the present embodiment, the process target film 2 is processed using the mask layer 3, the substrate 1 may be processed using the mask layer 3. For example, the mask layer 3 may be used, for example, to form tranches in the substrate 1.

Next, various specific examples of the polymer molecule shown in FIG. 2A are described.

Figure 7A:
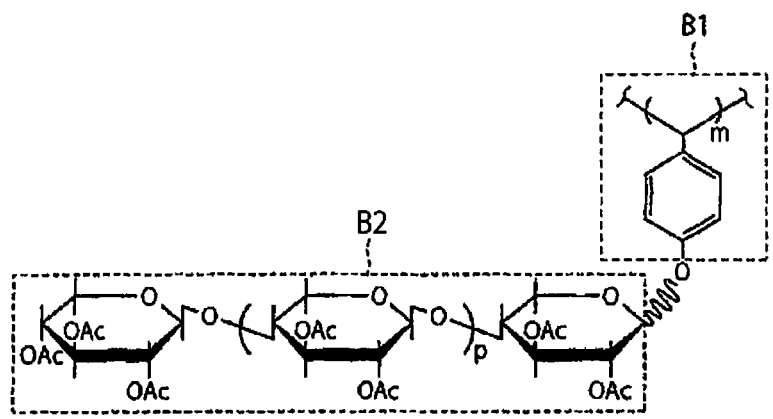
FIGS. 7A and 7B are chemical formulae showing a first example of a polymer molecule of the first embodiment.
Figure 7B:
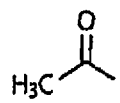

FIGS. 7A and 7B show a chemical formula indicating a first example of the polymer molecule of the first embodiment.

As shown in FIG. 7A, the polymer molecule of the first example includes a first block B1 and a second block B2. The first block B1 is, for example, polyhydroxystyrene (PHOST). "m" in FIG. 7A is an integer not less than two. In the first block B1, m hydroxystyrenes (HOSTs), a HOST being in the parentheses, polymerize to compose a PHOST. The HOST corresponds to a monomer and the PHOST corresponds to a polymer.

The second block B2 bonds to the first block B1. The second block B2 is, for example, a saccharide. Examples of the saccharide include cellulose, glucose obtained by polymerization of celluloses, xylose, and xylan obtained by polymerization of xyloses. "p" in FIG. 7A is an integer not less than two. In the second block B2 of the first example, p xyloses, a xylose being in the parentheses, polymerize to compose a xylan. The xylose corresponds to a monomer and the xylan corresponds to a polymer. In the first example, a portion of a cyclic structure of the xylose corresponds to the aforementioned unit portion P. Ac in the second block B2 denotes an acetyl group shown in FIG. 3B.

Next, second to eighth examples of the polymer molecule shown in FIG. 2A are described. In the following description, description of the matters common to those for the first example is omitted.

Figure 8:
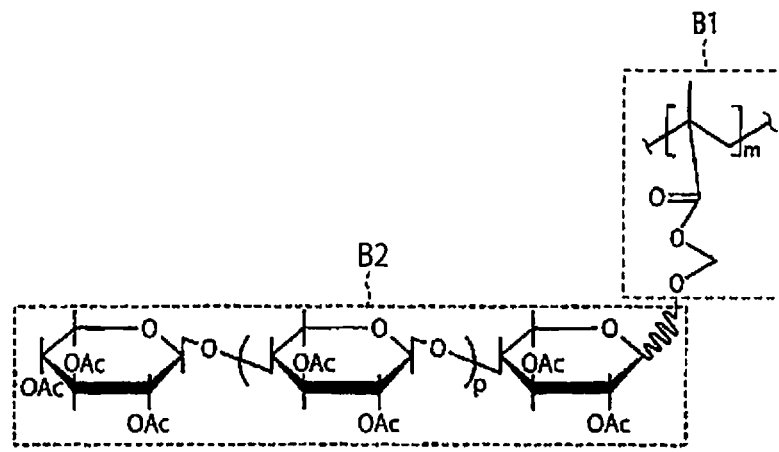
FIG. 8 is a chemical formula showing a second example of the polymer molecule of the first embodiment.

FIG. 8 is a chemical formula indicating a second example of the polymer molecule of the first embodiment. The first block B1 of the second example is, for example, polymethyl methacrylate (PMMA). In the first block B1, m methyl methacrylates (MMAs), an MMA being in the parentheses, polymerize to compose a PMMA. In the second block B2 of the second example, p xyloses, a xylose being in the parenthesis, polymerize to compose a xylan.

Figure 9:
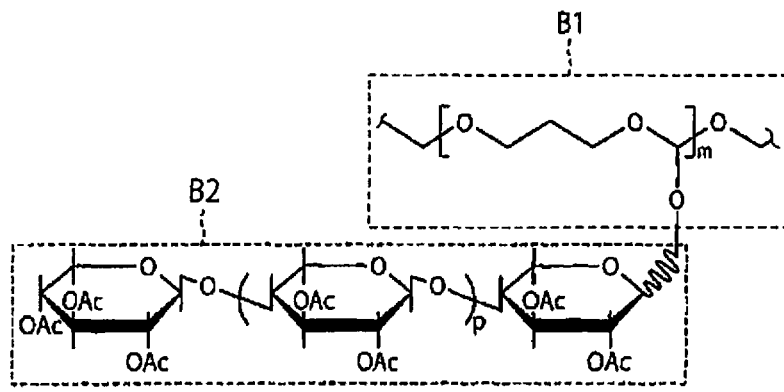
FIG. 9 is a chemical formula showing a third example of the polymer molecule of the first embodiment.

FIG. 9 is a chemical formula indicating a third example of the polymer molecule of the first embodiment. The first block B1 of the third example is, for example, polytrimethylenecarbide (PTMC).

Figure 10:
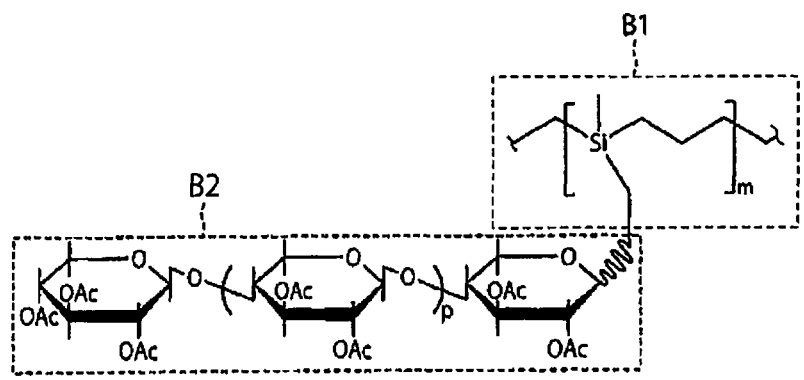
FIG. 10 is a chemical formula showing a fourth example of the polymer molecule of the first embodiment.

FIG. 10 is a chemical formula indicating a fourth example of the polymer molecule of the first embodiment. The first block B1 of the fourth example is, for example, polydimethylsilacyclobutane (PDMSB).

Figure 11:
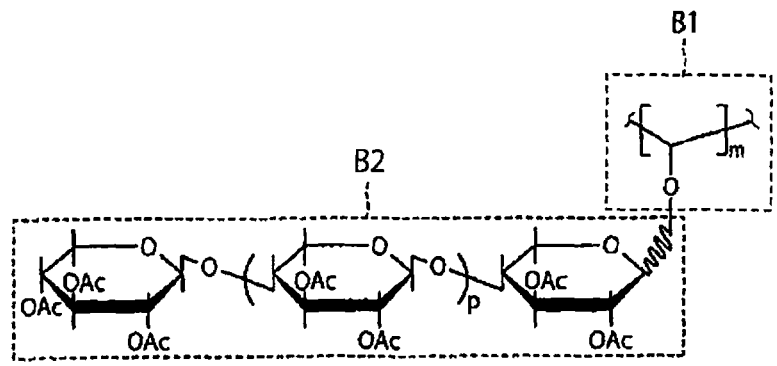
FIG. 11 is a chemical formula showing a fifth example of the polymer molecule of the first embodiment.

FIG. 11 is a chemical formula indicating a fifth example of the polymer molecule of the first embodiment. The first block B1 of the fifth example is, for example, polyvinyl alcohol (PVA).

Figure 12:
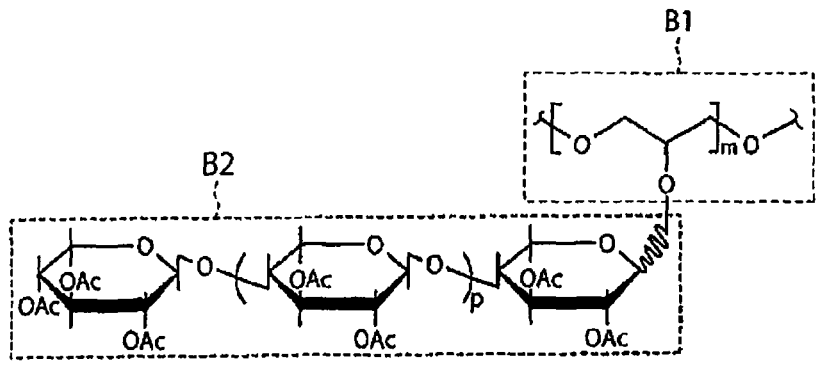
FIG. 12 is a chemical formula showing a sixth example of the polymer molecule of the first embodiment.

FIG. 12 is a chemical formula indicating a sixth example of the polymer molecule of the first embodiment. The first block B1 of the sixth example is, for example, polyglycerol (PG).

Figure 13:
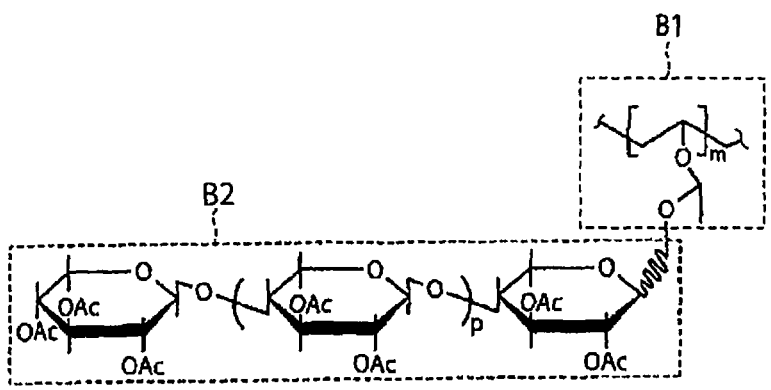
FIG. 13 is a chemical formula showing a seventh example of the polymer molecule of the first embodiment.

FIG. 13 is a chemical formula indicating a seventh example of the polymer molecule of the first embodiment. The first block B1 of the seventh example is, for example, polyvinyl acetate (PVAC).

Figure 14:
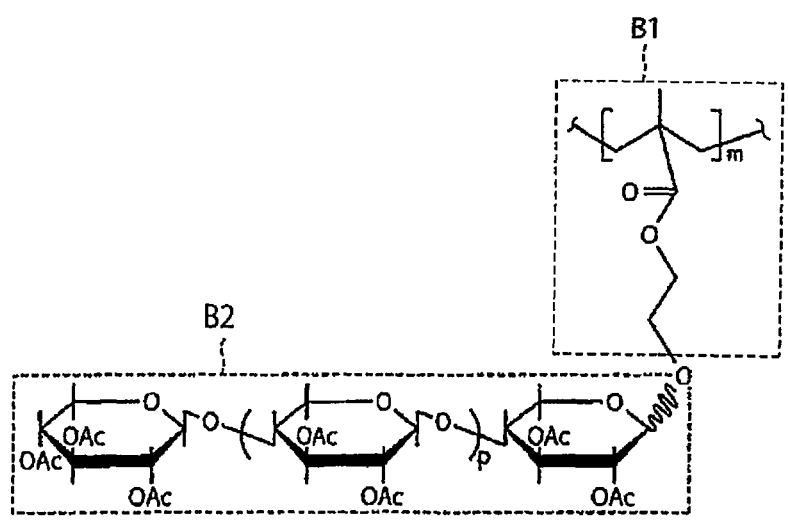
FIG. 14 is a chemical formula showing an eighth example of the polymer molecule of the first embodiment.

FIG. 14 is a chemical formula indicating an eighth example of the polymer molecule of the first embodiment. The first block B1 of the eighth example is, for example, polyhydroxyethyl methacrylate (PHEMA).

Hereafter, modifications of the first block B1 and the second block B2 are described.

Examples of the first block B1 may include polymethyl methacrylate, polyvinyl alcohol, polytrimethylenecarbide, polydimethyldisilane, polydimethylsilacyclobutane, polyglycerol, polyvinyl acetate, polyhydroxymethyl methacrylate, polyethyl methacrylate, polyhydroxyethyl methacrylate, polylactic acid, polyethylene oxide, and polyhydroxystyrene.

The second block B2 may have a molecular structure in which oxygen is added to a cyclic structure such as cyclic ethers, such, for example, as polyfuran, polytetrahydrofuran, polyfurfural, polytetrahydropyran, polyfurfuryl alcohol, polypyran, polyisobenzofuran, polybenzodioxole, polybenzaldehyde, polyoxyoxirane, polyoxetane, polydioxane, and polydioxolane.

The second block B2 may have a molecular structure of a saccharide. Examples of saccharides have structures of monosaccharides, disaccharides, trisaccharides, tetrasaccharides, oligosaccharides, and polysaccharides. Examples of the second block B2 as a monosaccharide may include heptose as a heptose, hexose as a hexose, pentose as a pentose, tetrose as a tetrose, and triose as a triose. Examples of the hexose may include psicose, fructose, tagatose, glucose, altrose, mannose, galactose, and idose. Examples of the pentose may include ribose, lyxose, xylose, arabinose, apiose, ribulose, and xylulose. Examples of the tetrose may include erythrose, threose, and erythrulose. Examples of the triose may include glyceraldehyde, and dihydroxyacetone.

Examples of the second block B2 as a disaccharide include trehalose, isotrehalose, kojibiose, sophorose, nigerose, laminaribiose, maltose, cellobiose, isomaltose, gentiobiose, sucrose, lactose, and turanose.

Examples of the second block B2 as a trisaccharide include raffinose, melezitose, and maltotriose.

Examples of the second block B2 as a tetrasaccharide include acarbose, and stachyose.

Examples of the second block B2 as an oligosaccharide include xylooligosaccharide, and xylan.

Examples of the second block B2 as a polysaccharide may include starch, amylose, amylopectin, glycogen, cellulose, pectin, and glucomannan. Moreover, examples of the second block B2 include cyclodextrin, which is cyclic.

As above, in the present embodiment, by supplying energy to the mask layer 3, the first region which can contain metal atoms or tends to contain metal atoms, and the second region which cannot contain metal atoms or hardly contains metal atoms are formed in the mask layer 3, and the mask layer 3 having the first and second regions is impregnated with metal atoms. According to the present embodiment as above, before patterning the mask layer 3, the mask layer 3 can be caused to contain metal atoms.

Moreover, in the present embodiment, after the mask layer 3 having the first and second regions is impregnated with metal atoms, the mask layer 3 is developed (patterned). Therefore, according to the present embodiment, etching resistance of the first region can be made higher than etching resistance of the second region, and the second region can be removed while leaving the first region in place.

While certain embodiments have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and spirit of the inventions.

The invention claimed is:

1. A pattern forming method comprising:
   forming a first film on a substrate;
   supplying energy to the first film to form a first region to which the energy have been supplied, and a second region including a region to which the energy has been supplied and a region to which the energy has not been supplied;
   impregnating at least the first region out of the first and second regions with metal atoms; and
   developing the first film after impregnating the first region with the metal atoms to remove the region to which the energy has been supplied in the second region and the region to which the energy has not been supplied in the second region while leaving the first region,
   wherein
   the first film includes a first molecule having a first portion taking a cyclic structure or an acyclic structure,
   the first region includes at least the first molecule having the first portion that has the acyclic structure,
   the second region includes at least the first molecule having the first portion that has the cyclic structure, and
   the cyclic structure has a structure in which one or more carbon atoms and one or more oxygen atoms bond together, and the acyclic structure has a structure in which a bond between one of the carbon atoms and one of the oxygen atoms of the cyclic structure is cleaved.

2. The method of claim 1, comprising supplying the energy to the first film to alternately form a plurality of first regions impregnatable with the metal atoms, and a plurality of second regions different from the first regions.

3. The method of claim 1, wherein the energy is supplied to the first film by irradiating the first film with radiation or by heating the first film.

4. The method of claim 3, wherein the radiation is an electromagnetic wave or a particle beam.

5. The method of claim 1, wherein the first molecule is capable of bonding to the metal atom when the first portion has the acyclic structure, and is incapable of bonding to the metal atom when the first portion has the cyclic structure.

6. The method of claim 1, wherein a structure of the first portion repeatedly changes from one of the cyclic structure and the acyclic structure to the other as the energy is increasing at a position of the first portion.

7. The method of claim 6, wherein N first regions are formed in the first film by causing the structure of the first portion to change from one of the cyclic structure and the acyclic structure to the other at most N times, where N is an integer of one or more.

8. The method of claim 1, wherein the first molecule is composed of a saccharide.

9. A method of manufacturing a semiconductor device, comprising:
   preparing a substrate provided with a second film and a first film on the second film;
   supplying energy to the substrate to have an intensity distribution in an in-plane direction of the substrate to form a first region to which the energy have been supplied, and a second region including a region to which the energy has been supplied and a region to which the energy has not been supplied;
   supplying gas including metal atoms to the substrate;
   developing the first film after supplying the gas to remove the region to which the energy has been supplied in the second region and the region to which the energy has not been supplied in the second region while leaving the first region; and
   processing the second film using the developed first film,
   wherein
   the first film includes a first molecule having a first portion taking a cyclic structure or an acyclic structure,
   the first region includes at least the first molecule having the first portion that has the acyclic structure,
   the second region includes at least the first molecule having the first portion that has the cyclic structure, and the cyclic structure has a structure in which one or more carbon atoms and one or more oxygen atoms bond together, and the acyclic structure has a structure in which a bond between one of the carbon atoms and one of the oxygen atoms of the cyclic structure is cleaved.

10. The method of claim 9, comprising supplying the energy to the first film to alternately form a plurality of first regions impregnatable with the metal atoms, and a plurality of second regions different from the first regions.

11. The method of claim 9, wherein the energy is supplied to the first film by irradiating the first film with radiation or by heating the first film.

12. The method of claim 11, wherein the radiation is an electromagnetic wave or a particle beam.

13. The method of claim 9, wherein the first molecule is capable of bonding to the metal atom when the first portion has the acyclic structure, and is incapable of bonding to the metal atom when the first portion has the cyclic structure.

14. The method of claim 9, wherein a structure of the first portion repeatedly changes from one of the cyclic structure and the acyclic structure to the other as the energy is increasing at a position of the first portion.

15. The method of claim 14, wherein N first regions are formed in the first film by causing the structure of the first portion to change from one of the cyclic structure and the acyclic structure to the other at most N times, where N is an integer of one or more.

16. The method of claim 9, wherein the first molecule is composed of a saccharide.

17. A pattern forming method comprising:
forming a first film on a substrate;
supplying energy to the first film to form a first region to which the energy have been supplied, and a second region including a region to which the energy has been supplied and a region to which the energy has not been supplied;
impregnating at least the first region out of the first and second regions with metal atoms; and
developing the first film after impregnating the first region with the metal atoms to remove the region to which the energy has been supplied in the second region and the region to which the energy has not been supplied in the second region while leaving the first region,
wherein
the first film includes a first molecule having a first portion taking a cyclic structure or an acyclic structure,
the first region includes at least the first molecule having the first portion that has the acyclic structure,
the second region includes at least the first molecule having the first portion that has the cyclic structure, and
a structure of the first portion repeatedly changes from one of the cyclic structure and the acyclic structure to the other as the energy is increasing at a position of the first portion.

* * * * *